(12) United States Patent
Brad et al.

(10) Patent No.: US 7,224,172 B1
(45) Date of Patent: May 29, 2007

(54) DEVICE AND METHOD FOR SHIELDING ELECTROMAGNETIC EMISSIONS OF EQUIPMENT SERVICE VEHICLE

(75) Inventors: Daniel J. Brad, Berlin, WI (US); Ronald P. Ziebell, Oshkosh, WI (US)

(73) Assignee: Oshkosh Truck Corporation, Oshkosh, WI (US)

( * ) Notice: Subject to any disclaimer, the term of this patent is extended or adjusted under 35 U.S.C. 154(b) by 0 days.

(21) Appl. No.: 11/369,196

(22) Filed: Mar. 6, 2006

(51) Int. Cl.
 *G01R 27/28* (2006.01)

(52) U.S. Cl. .................................. 324/628; 324/627

(58) Field of Classification Search ................ 324/627, 324/628
See application file for complete search history.

(56) References Cited

U.S. PATENT DOCUMENTS 6,610,922 B1 * 8/2003 Twiss et al. ................ 174/390

* cited by examiner

*Primary Examiner*—Vincent Q. Nguyen
(74) *Attorney, Agent, or Firm*—Foley & Lardner LLP

(57) ABSTRACT

A system for shielding an engine component of an equipment service vehicle including an enclosure, wherein the enclosure includes a surface having a plurality of apertures formed in the surface of the enclosure, the plurality of apertures being dimensioned to minimize electromagnetic emissions from the engine component of the equipment service vehicle.

35 Claims, 7 Drawing Sheets

DEVICE AND METHOD FOR SHIELDING ELECTROMAGNETIC EMISSIONS OF EQUIPMENT SERVICE VEHICLE

BACKGROUND

The present invention relates generally to the field of equipment service vehicles. More particularly, the present invention relates to shielding for electromagnetic emissions in equipment service vehicles.

DESCRIPTION OF RELATED ART

Equipment service vehicles perform a wide range of functions. Such vehicles include military vehicles, fire fighting vehicles, concrete placement and delivery vehicles, refuse handling vehicles, ambulances, airport and municipal vehicles (e.g., aircraft rescue and fire fighting vehicle, snow plows, dump trucks, etc.), utility vehicles (e.g., communications installation and service vehicles), etc. These vehicles are increasingly complex in terms of the number of electrical components necessary for operation of the vehicle. Unfortunately, the electrical components of equipment service vehicles often produce varying levels of electromagnetic emissions.

The electromagnetic emissions of certain electrical components of an equipment service vehicle may interfere with the performance of other vehicle systems, such as control systems, computers, radios, radars, transmitters, and receivers. The electromagnetic emissions tend to create a "noisy" environment within which the electrical components must operate. Particularly, in military vehicles, the ability of each electrical component to operate in a noisy environment is often critical to the performance of the vehicle. The electrical components of a military vehicle need to be able to coexist in a close environment without experiencing component failure due to electromagnetic interference. For example, in military vehicles, electrical components, such as computers, may need to coexist in the vehicle, without inducing electromagnetic interference, with powerful radio and microwave transmitters, radar equipment, and various engine components, in order to meet military standards. The U.S. Department of Defense has established requirements for testing and controlling the electromagnetic emissions of electronic equipment used in military vehicles. Military Standard 461 (Mil-Std 461) is one of the requirements for controlling and testing electromagnetic interference characteristics of electrical and electromechanical equipment and systems for use by the military. Mil-Std 461 requires that electromagnetic emissions from a military vehicle not exceed a 24 decibel (dB or µV/m) limit over that frequency range.

Problems with electromagnetic interference are often compounded because equipment service vehicles are often used together. For example, in a military setting, vehicles often travel as a convoy, for example, to transport cargo or for protection from enemy forces. As a result, the electromagnetic interference is multiplied by the grouping of equipment service vehicles in one location. Therefore, it would be advantageous to shield certain electrical components of an equipment service vehicle. Particularly, it would be advantageous to shield the engine components of an equipment service vehicle, in order to reduce the electromagnetic interference caused by the engine components of the vehicle. In this manner, the shielding would permit the electrical components to coexist in a noisy environment, with a reduced likelihood of component failure due to electromagnetic emissions. Additionally, it would be advantageous to provide a system for shielding the engine components of an equipment service vehicle, in order to reduce the electromagnetic emissions within a given frequency range, in accordance with military standards for electromagnetic emissions.

SUMMARY

One embodiment of the invention relates to a system for shielding an engine component of an equipment service vehicle. The system includes an enclosure, wherein the enclosure has a surface having a plurality of apertures formed in the surface of the enclosure. The plurality of apertures may be dimensioned to minimize electromagnetic emissions from the engine component of the equipment service vehicle.

Another embodiment of the invention relates to a system for shielding an engine component of an equipment service vehicle, wherein the equipment service vehicle includes a frame assembly and a body, such that the body may be coupled to the frame assembly. The system includes an enclosure having a plurality of sheet-metal panels, including a top panel, a bottom panel, and a plurality of sidewall panels, wherein each of the plurality of sheet-metal panels include an edge and a surface, such that the enclosure may be formed by joining an edge of each of the plurality of sheet metal-panels with an edge of a contiguous sheet-metal panel. The sheet-metal panels include a plurality of apertures formed in the surface of each sheet-metal panel. The system further includes a plurality of fastening elements configured to fasten the sheet-metal panels to the frame assembly or body of the equipment service vehicle. Each of the plurality of apertures includes a dimension in a first direction between 0.25 inches to 0.75 inches and a dimension in a second direction between 0.75 inches to 1.25 inches, such that the plurality of apertures are configured to minimize electromagnetic emissions within the frequency range of two megahertz (2 MHz) to one gigahertz (1 GHz).

Another embodiment of the invention relates to a method for shielding an engine component of an equipment service vehicle including forming an enclosure to surround the engine component, wherein the enclosure includes opposing sidewall surfaces and a surface substantially perpendicular to the sidewall surfaces, each surface having an at least one edge and a plurality of apertures formed in the surfaces. The plurality of apertures may be dimensioned to minimize electromagnetic emissions from the engine component of the equipment service vehicle. The method further includes joining together an edge of each surface such that an edge of each surface may be adapted to abut an edge of an adjacent surface to define the enclosure and securing the enclosure to the equipment service vehicle.

Another embodiment of the invention relates to a military service vehicle including a movable frame assembly, a body including an occupant compartment, a plurality of drive wheels coupled to the frame assembly, an engine, an enclosure for the engine, and a plurality of fastening elements configured to secure the sheet-metal panels to the military service vehicle The enclosure for the engine includes a plurality of sheet-metal panels, including a top panel, a bottom panel, and a plurality of sidewall panels, each of the plurality of sheet-metal panels having an edge and a surface, the enclosure being formed by joining an edge of each of the plurality of sheet metal-panels with an edge of a contiguous sheet-metal panel. The sheet-metal panels include a plurality of apertures formed in the surface of each sheet-metal panel.

Another embodiment of the invention relates to a system for shielding an engine component of a military service vehicle. The vehicle includes a movable frame assembly, a body including an occupant compartment, and a plurality of drive wheels coupled to the frame assembly. The system comprises an enclosure for the engine component having a plurality of sheet-metal panels, including a top panel, a bottom panel, and a plurality of sidewall panels. Each of the plurality of sheet-metal panels has an edge and a surface, wherein the enclosure may be formed by joining an edge of each of the plurality of sheet metal-panels with an edge of a contiguous sheet-metal panel. The sheet-metal panels include a plurality of uniformly distributed apertures formed in the surface of a sheet-metal panel. The plurality of apertures have a dimension in a first direction in the range of 0.01 inches to 1.25 inches and a dimension in a second direction in the range of 0.01 inches to 1.25 inches, wherein the plurality of apertures are configured to minimize electromagnetic emissions from the vehicle within the frequency range of two megahertz (2 MHz) to one-hundred gigahertz (100 GHz). A plurality of fastening elements are configured to secure the enclosure to the military service vehicle.

DETAILED DESCRIPTION

Figure 1:
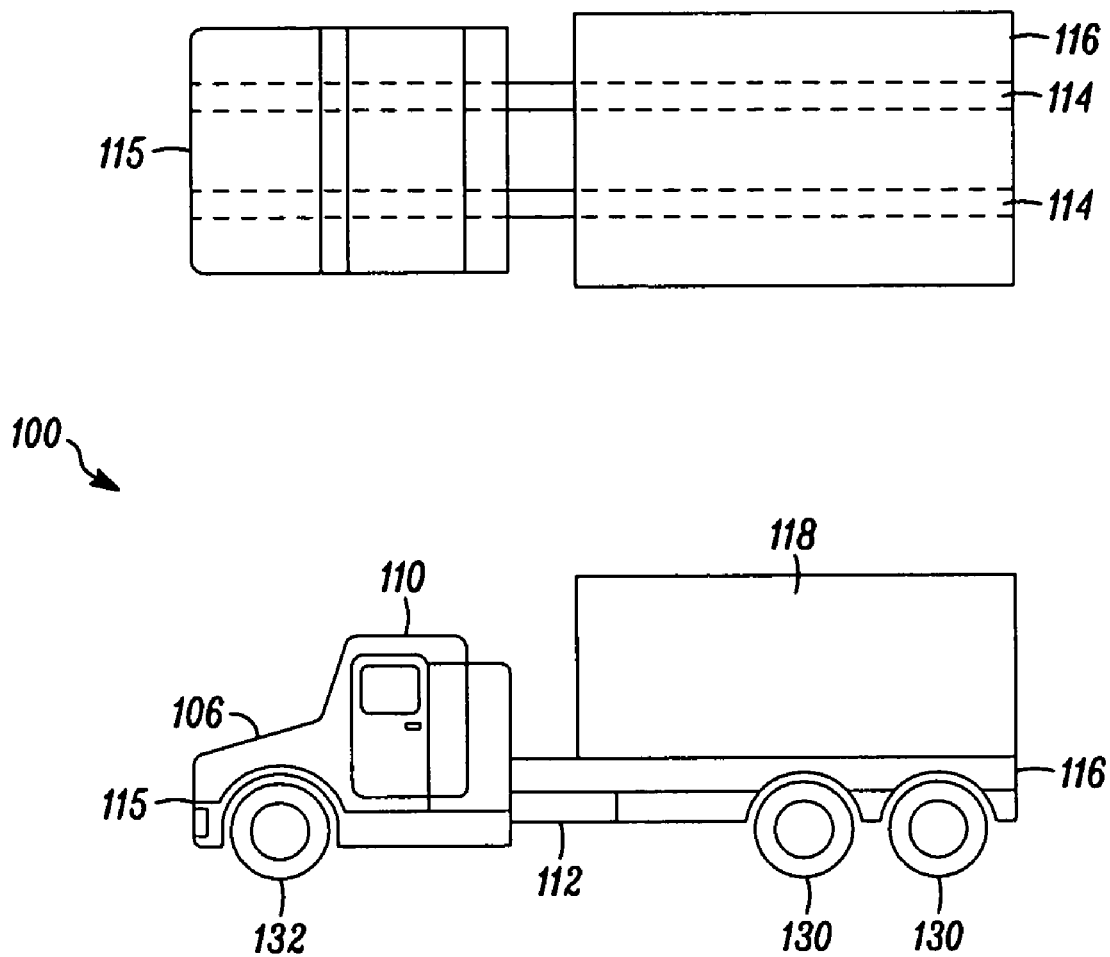
FIG. 1 is a perspective view of an equipment service vehicle according to an exemplary embodiment.

FIG. 1 shows an exemplary embodiment of an equipment service vehicle shown as military service vehicle 100. Military service vehicle 100 is preferably a medium or heavy duty equipment service vehicle, configured to perform a wide ranging number of functions. For example, vehicles such as military service vehicle 100 may function as a military transport vehicle for service personnel, supplies, and/or equipment. Additionally, military service vehicle 100 may provide other functions, for example, serving as a mobile communications center for a military unit. Military service vehicle 100 may preferably be equipped with a plurality of vehicle control systems, which may produce electromagnetic emissions. For example, an exemplary embodiment of military service vehicle 100 may include an engine control system, a transmission control system, a central tire inflation system, a central braking control system, a climate control system and so on. In order to reduce the levels of electromagnetic emissions being radiated by the plurality of vehicle components and control systems of military service vehicle 100, mesh shielding 120 (shown in FIG. 2) is preferably mounted to military service vehicle 100, as described herein in relation to FIG. 2.

It should be understood that although the systems of shielding for electromagnetic emissions will be described in detail herein with reference to military service vehicle 100, one or more of the systems and methods for shielding electromagnetic emissions herein may be applied to, and find utility in, other types of military vehicles or other types of equipment service vehicles as well. For example one or more of the systems for shielding for electromagnetic emissions may be suitable for use with fire fighting vehicles, concrete placement vehicles, refuse handling vehicles, ambulances, other emergency vehicles, airport and municipality utility vehicles, etc., all of which may require certain electrical and/or electromechanical systems to operate in environments potentially affected by electromagnetic interference. Additionally, one or more of the systems may be applied to, and find utility in, a military vehicle employing a monocoque hull structure, such that the uni-body construction of the vehicle supports the load of the vehicle instead of a vehicle frame. In such an embodiment, the systems of shielding for electromagnetic emissions may preferably be secured to the hull or uni-body structure of the vehicle.

Referring to FIG. 1, military service vehicle 100 is shown as generally including a chassis or frame assembly 112 as a support structure for the components of military service vehicle 100. According to an exemplary embodiment, frame assembly 112 generally includes first and second frame members 114 that are arranged as two generally parallel chassis rails extending in a fore and aft direction between a first end 115 (i.e., a forward portion of military service vehicle 100) and a second end 116 (i.e., a rearward portion of military service vehicle 100). The first and second frame members 114 are configured as elongated structure or supportive members (e.g., a beam, a channel, or tubing, etc.). The first and second frame members 114 are spaced apart laterally and define a cavity there between. A plurality of drive wheels 130 and 132 are rotatably coupled to the frame assembly 112. The number and/or configuration of drive wheels 108 may vary depending on the embodiment of the vehicle. According to the embodiment illustrated, military service vehicle 100 may utilize eight to ten drive wheels 130 and 132 (two tandem wheel sets 130 at the second end 116 of military service vehicle 100 and one wheel set 132 at the first end 115 of military service vehicle 100). In this configuration the wheel set 132 at the first end 115 is steerable, while the remaining wheel sets 130 are configured to be driven by a drive apparatus. According to various exemplary embodiments military service vehicle 100 may have any number of wheel systems and configurations, including, but not limited to, 4, 8, 10, 12, 16 or 18 wheels.

Military service vehicle 100 is further shown as including a body 106 attached to frame assembly 112. Body 106 further includes an occupant compartment or cab 110 supported by frame assembly 112. Cab 110 includes an enclosure or area capable of receiving a human operator or vehicle driver. Cab 110 is supported at the first end 115 of frame assembly 112 and includes controls associated with the maneuvering and manipulation of military service vehicle 100 (e.g. steering controls, vehicle control systems, etc.). Military service vehicle 100 further includes a cargo bed 118 attached to frame assembly 112. Cargo bed 118 is supported at the second end 116 of frame assembly 112 for retaining the cargo (e.g., equipment, supplies, personnel, etc.) of military service vehicle 100. Cargo bed 118 may be an enclosed or open-air cargo area.

Figure 2:
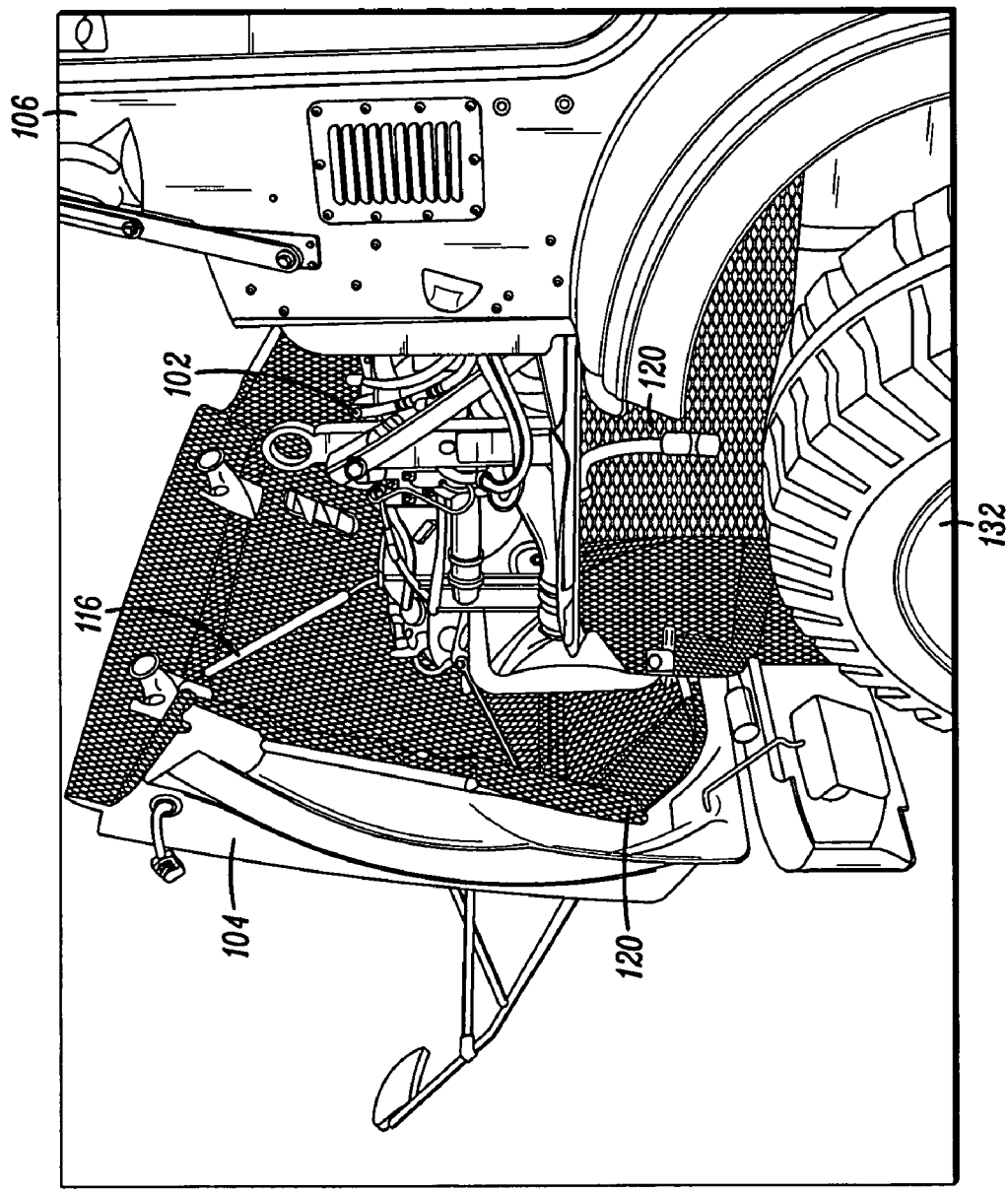
FIG. 2 is a partial detailed view of an engine compartment of an equipment service vehicle according to an exemplary embodiment.

Referring now to FIG. 2, a partial detailed view of the engine compartment of military service vehicle 100 is shown. Engine block 102 is mounted upon frame assembly 112. Engine block 102 may include various vehicle drive controls including a vehicle transmission, a power source (e.g., a battery, alternator, etc.), an engine climate control system, fan belts, control units, drive shaft and drive shaft motor, valves, hoses, and conduits, etc. Engine block 102 is housed in an engine compartment covered by vehicle hood 104. Hood 104 is shown in an upright or raised position, in order to expose engine block 102. Hood 104 may be positioned in the upright position by one or more hydraulic lifts 116 for raising and supporting hood 104. Cab 110 for housing a vehicle operator or driver is positioned adjacent to engine block 102. As mentioned, cab 110 may include various steering controls or vehicle control systems therein.

Figure 7:
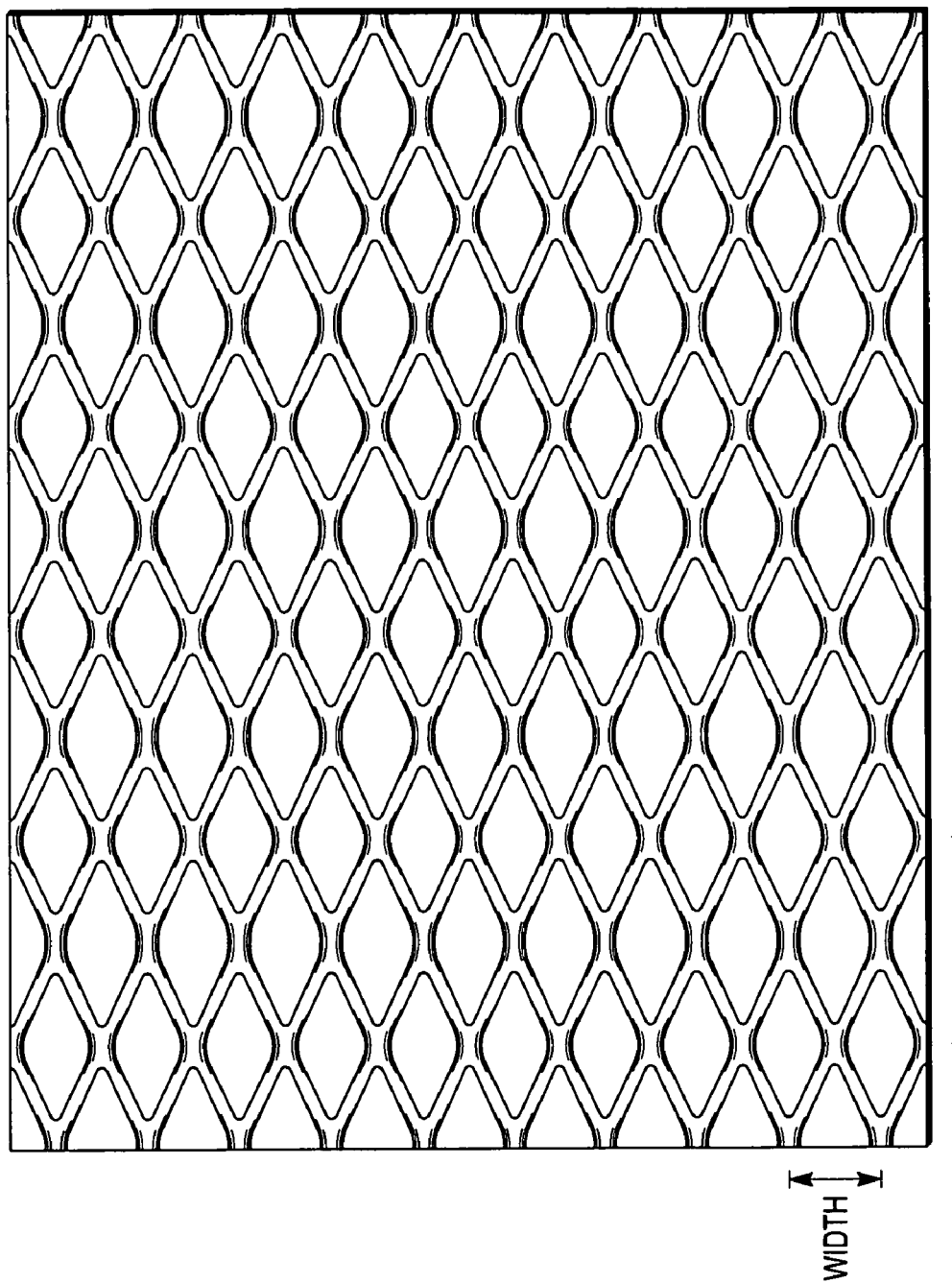
FIG. 7 is a perspective view of a sheet of expanded metal according to an exemplary embodiment.

FIG. 2 also shows a plurality of sheet metal panels or mesh shielding 120 secured to the military service vehicle 100. Mesh shielding 120 may be an expanded steel grating or a sheet of wire mesh. Mesh shielding 120 is secured around the engine block 102 of military service vehicle 100. Mesh shielding 120 preferably includes opposing sidewall surfaces and may include a top and bottom surface which may be positioned around engine block 102. Each of the surfaces of mesh shielding 120 may be joined together with an adjacent surface in order to create an enclosure around engine block 102. Mesh shielding 120 is shown as being secured adjacent to hood 104 of military service vehicle 100. Mesh shielding 120 (as also shown in FIG. 7) may include a plurality of parallelogram-shaped apertures or openings that are dimensioned to be approximately within the range of 0.25 inches to 0.75 inches in width and within the range of 0.75 inches to 1.25 inches in length. Preferably, the parallelogram-shaped apertures may be approximately 0.5 inches in width and 1 inch in length. The plurality of apertures in mesh shielding 120 are dimensioned to minimize the electromagnetic emissions from engine block 102 of military service vehicle 100.

Figure 3:
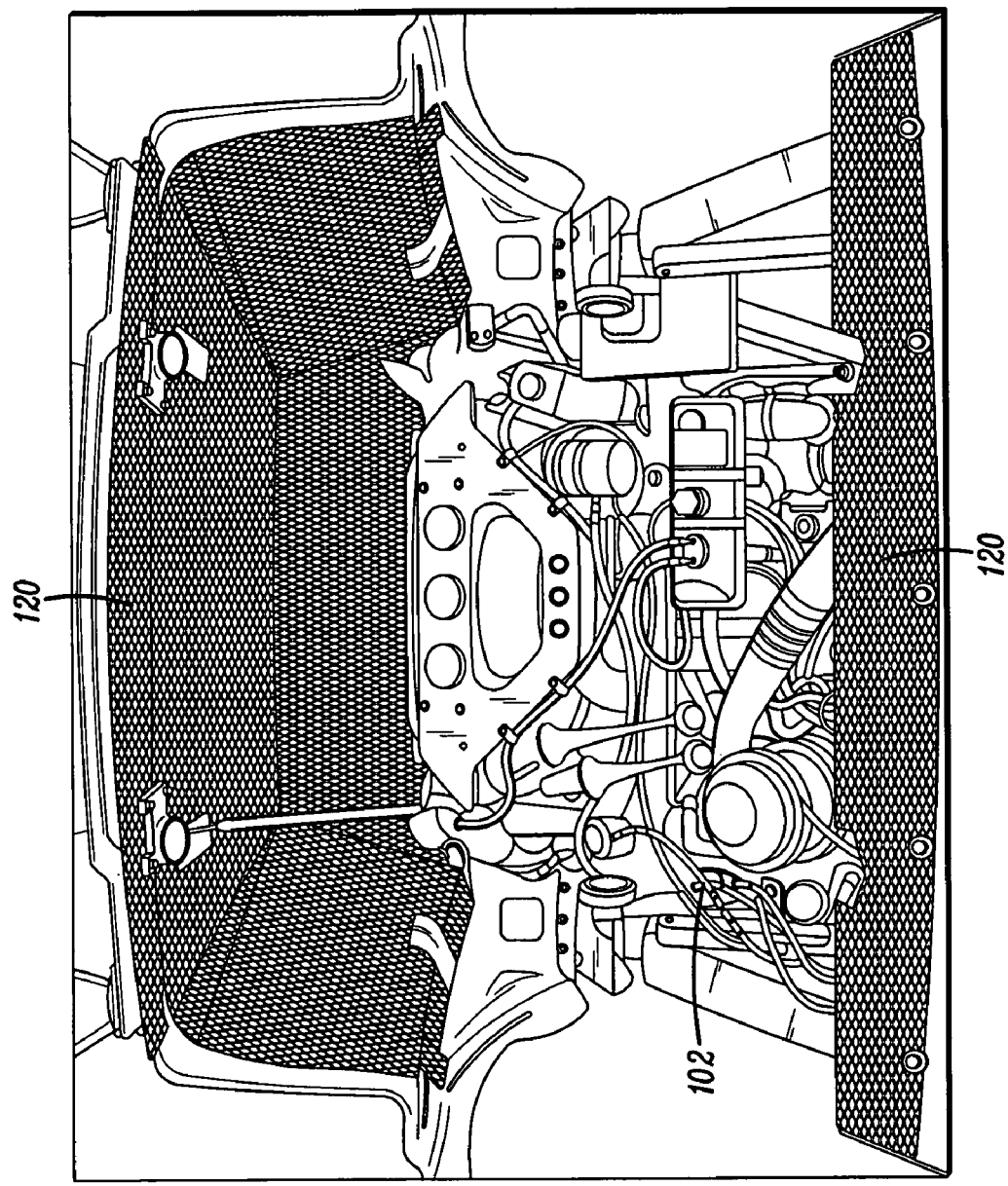
FIG. 3 is a partial detailed view of the engine compartment of an equipment service vehicle according to an exemplary embodiment.

FIG. 3 is a partial detailed view of the engine compartment of military service vehicle 100 according to an exemplary embodiment. FIG. 3 also provides an alternate view of the embodiment shown in FIG. 2. Mesh shielding 120 is mounted adjacent to cab 110 along a firewall of the vehicle engine compartment. Mesh shielding 124, being mounted adjacent to hood 104, provides a top surface of an enclosure for engine block 102. Upon positioning hood 104 from its upright position to its closed position, mesh shielding 120 covers an upper portion of engine block 102 to facilitate minimizing electromagnetic emissions from engine block 102.

Figure 4:
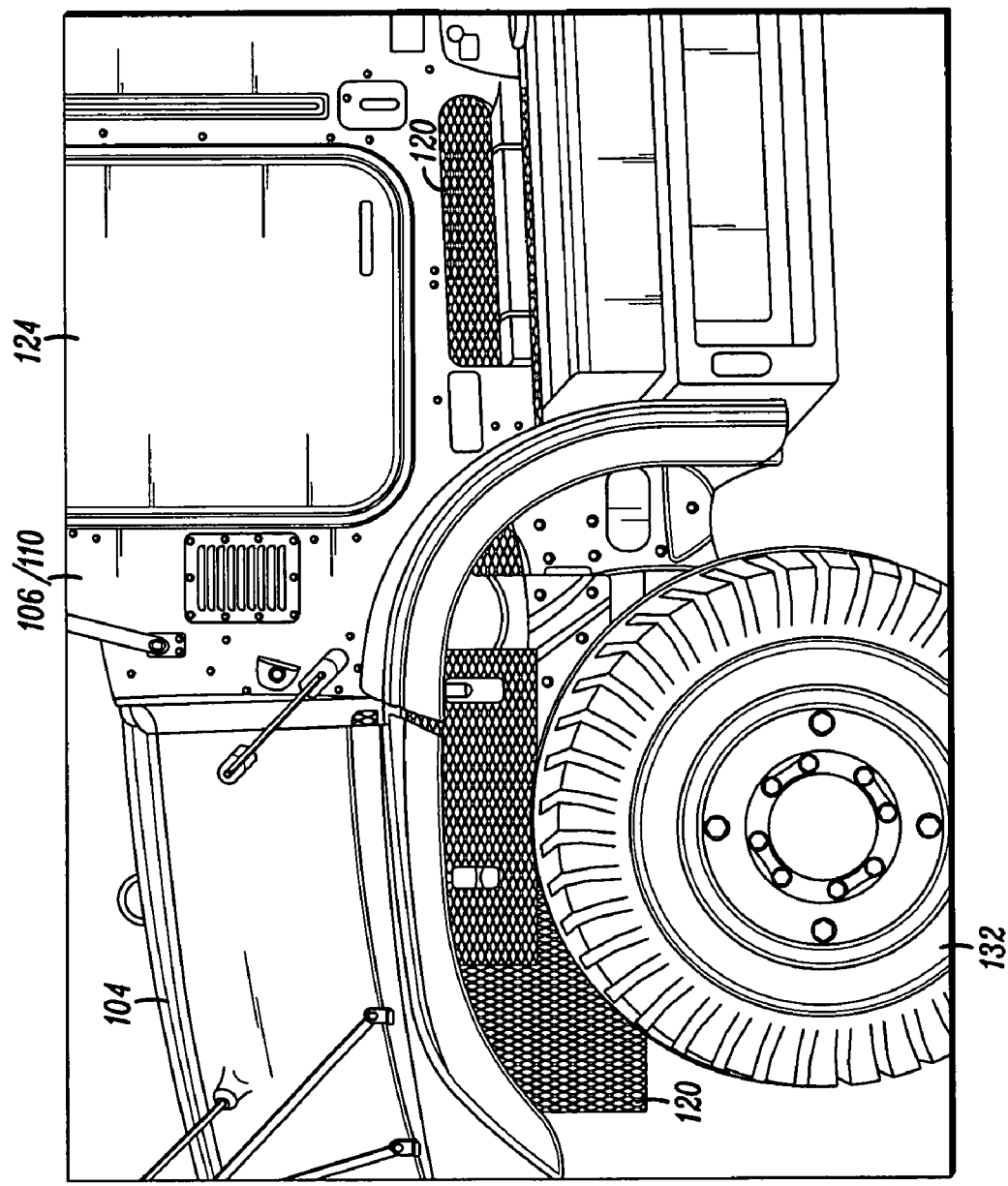
FIG. 4 is a partial side view of an equipment service vehicle according to an exemplary embodiment.
Figure 5:
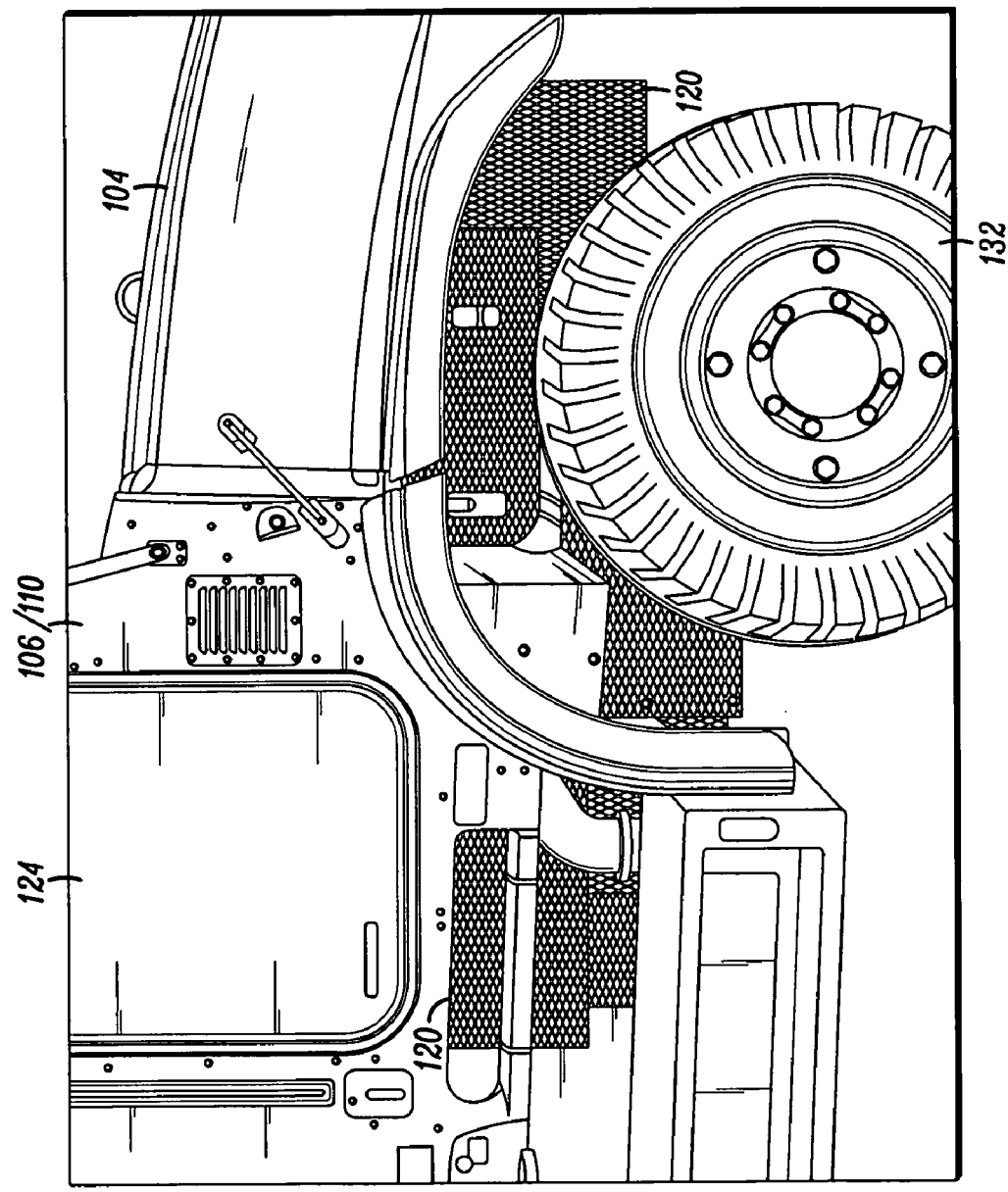
FIG. 5 is a partial side view of an equipment service vehicle according to an exemplary embodiment.

FIGS. 4 and 5 each provide a partial side view of a military service vehicle according to an exemplary embodiment. Hood 104 is shown in a closed position such that hydraulic lifts 116 have been actuated to lower the hood upon engine block 102. An entry door 124 to cab 110 is shown. The entry door 124 permits a vehicle occupant or driver to access the interior of cab 110. Wheels 132 are also shown, which are positioned toward the front portion 115 of military service vehicle 100. Mesh shielding 120 is also shown enclosing engine block 102 (not shown) for minimizing electromagnetic emissions. Additionally, mesh shielding 120 is advantageous because it facilitates heat dissipation from engine block 102.

Figure 6:
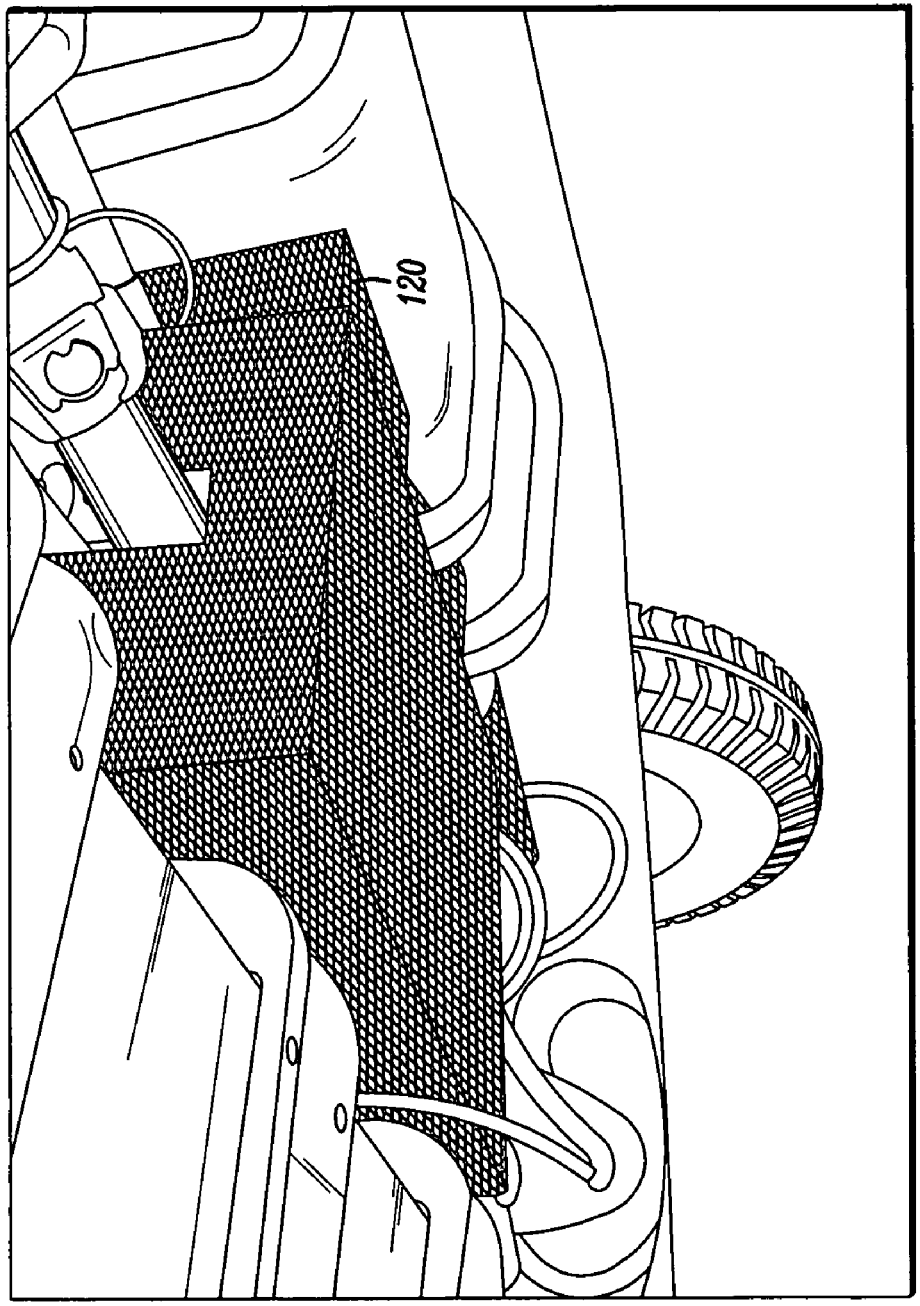
FIG. 6 is a partial detailed view of an undercarriage of an equipment service vehicle.

Referring now to FIG. 6, a partial detailed view of the undercarriage of a military service vehicle 100 is shown. Mesh shielding 120 may be provided to enclose the lower portion of the undercarriage of a military service vehicle 100. Mesh shielding 120 may be formed as an enclosure with opposing sidewalls and a bottom surface wall for enclosing engine block 102. The enclosure may be secured to the military service vehicle via the frame assembly 112, vehicle body 106, cab 110, or various other elements of military service vehicle 100.

Referring now to FIG. 7, a perspective view of a sheet of expanded metal is shown. The sheet of metal is an exemplary embodiment of mesh shielding 120. As mentioned previously, mesh shielding 120 may be dimensioned to be 0.25 inches to 0.75 inches in width and 0.75 to 1.25 inches in length. Preferably, the parallelogram-shaped apertures are approximately 0.5 inches in width and 1 inch in length. However, it should be understood that the dimensions of the apertures in mesh shielding 120 are partly determined based upon the frequency range of the electromagnetic emissions from components and/or control systems of military service vehicle 100. Particularly, the dimensions of the apertures are determined by the frequency range of electromagnetic emissions emitted from engine block 102. Therefore, depending on the operating frequency range, a mesh shielding of other dimensions may be employed for minimizing the electromagnetic wave propagation.

According to a preferred frequency range, between two megahertz (2 MHz) and one gigahertz (1 GHz), mesh shielding 120 was selected to have apertures approximately 0.5 inches wide and 1 inch long. Electromagnetic field theory has established a relationship between the size of the apertures in an enclosure and the wavelength ($\lambda$), such that electromagnetic waves may not pass through the apertures, to a great extent, depending on the size and shape of the apertures. The relationship between wavelength and the size of the aperture is generally understood as restricting the aperture to be a fractional unit of the wavelength. According to an exemplary embodiment, the size of the apertures may be dimensioned to be $1/10^{th}$ of the shortest wavelength within a given frequency range. The wavelength may be calculated based on, for example, the frequency range, using the equation: e.g., $\lambda = c/f$.

where $\lambda$ is the wavelength of the highest frequency in meters;

c is the speed of light in a vacuum measured in meters/second; and f is the highest frequency in Hertz.

Therefore, the size of the apertures in a preferred embodiment may be approximately $1/10^{th}$ of the wavelength as calculated by the equation above. For example, with a speed of light constant, c, of 299,792,458 m/s and a frequency of 1 GHz, the size of the apertures may be calculated as follows:

$$\lambda = \frac{299,792,458 \text{ m/s}}{1,000,000,000 \text{ Hz}}$$
$$= 0.29 \text{ m}$$
$$= 11.4 \text{ inches}$$

$$\text{Size of Aperture} \approx \frac{1}{10}(\lambda)$$
$$\approx \frac{1}{10}(11.4 \text{ in})$$
$$\approx 1.14 \text{ in}$$

In the frequency range of 2 MHz to 1 GHz, mesh shielding 120 may be selected to have a 1 inch long aperture, as it is less than $1/10^{th}$ of the shortest wavelength, i.e., 1.14 inches. Although apertures may be dimensioned at $1/10^{th}$ of the shortest wavelength within a given frequency range, it should be understood that different sized apertures may be employed to achieve a similar result. For example, in another preferred embodiment, apertures dimensioned at one-eighth ($1/8^{th}$) or one quarter ($1/4^{th}$) of the shortest wavelength, within a given frequency range may also be employed to reduce electromagnetic wave propagation and facilitate heat dissipation from engine block 102. Additionally, it should be understood that apertures of different sizes and shapes may be employed to reduce electromagnetic emissions at different frequency ranges, for example, within the frequency range of one gigahertz (1 GHz) to ten gigahertz (10 GHz), ten gigahertz (10 GHz) to one-hundred gigahertz (100 GHz), etc.

Throughout the specification, numerous advantages of preferred embodiments have been identified. It will be understood of course that it is possible to employ the teachings herein so as to without necessarily achieving the same advantages. Additionally, although many features have been described in the context of an enclosure for the engine of a military service vehicle, it will be appreciated that such features could also be implemented in the context of other types of vehicles as well, which may require certain electrical and/or electromechanical systems to operate in environments potentially affected by electromagnetic interference. For example, many of the advantages identified may be implemented in the context of a fire fighting vehicles, concrete placement vehicles, refuse handling vehicles, ambulances, other emergency vehicles, airport and municipality utility vehicles, etc. It should also be noted that the words "engine," "engine component," or "engine block" as used herein and in the claims are intended to encompass a device or component of a vehicle, including a transmission, power source, climate control system, fan belt, control unit, drive shaft, relays, actuators, fans and motors (e.g., wiper motor, heater fan motor, drive shaft motor, engine fan unit, etc.), and all valves, hoses, wiring, and conduits, which may be coupled or used in relation to the parts or components used to facilitate vehicle operation.

It is important to note that the construction and arrangement of the military service vehicle as shown in the various exemplary embodiments is illustrative only. Although only a few embodiments of the present inventions have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, elements shown as multiple parts may be integrally formed, the position of elements may be reversed or otherwise varied, and the nature or number of discrete elements or positions may be altered or varied. Accordingly, all such modifications are intended to be included within the scope of the present invention, as defined in the appended claims. The order or sequence of any process or method steps may be varied or re-sequenced according to alternative embodiments. Other substitutions, modifications, changes and omissions may be made in the design, operating conditions and arrangement of the exemplary embodiments without departing from the scope of the present inventions as expressed in the appended claims.

Many other changes and modifications may be made to the present invention without departing from the spirit thereof.

What is claimed is:

1. A system for shielding an engine component of an equipment service vehicle, comprising:
    an enclosure being configured to be secured to the vehicle for enclosing the engine component, the enclosure having opposing sidewall surfaces and a surface substantially perpendicular to the sidewall surfaces, each surface having at least one edge, the edge of each surface being adapted to abut an edge of an adjacent surface to define the enclosure,
    wherein the enclosure includes a surface having a plurality of apertures formed in the surface of the enclosure, the plurality of apertures being dimensioned to minimize electromagnetic emissions from the engine component of the equipment service vehicle.

2. A system according to claim 1, further comprising a plurality of fastening elements configured to secure the enclosure to the equipment service vehicle.

3. A system according to claim 1, wherein the plurality of apertures are uniformly dimensioned.

4. A system according to claim 1, wherein the plurality of apertures comprises square-shaped apertures.

5. A system according to claim 1, wherein the plurality of apertures comprises parallelogram-shaped apertures, each of the apertures having a dimension in a first direction in the range of 0.25 inches to 0.75 inches and a dimension in a second direction in the range of 0.75 inches to 1.25 inches.

6. A system according to claim 1, wherein the plurality of apertures are configured to minimize electromagnetic emissions within the frequency range of two megahertz (2 MHz) to one gigahertz (1 GHz).

7. A system according to claim 1, wherein the plurality of apertures are configured to minimize electromagnetic emissions within the frequency range of one gigahertz (1 GHz) to ten gigahertz (10 GHz).

8. A system according to claim 1, wherein the plurality of apertures are configured to minimize electromagnetic emissions within the frequency range of ten gigahertz (10 GHz) to one-hundred gigahertz (100 GHz).

9. A system according to claim 1, wherein the plurality of apertures are uniformly distributed on the surfaces of the enclosure.

10. A system according to claim 1, wherein the surfaces of the enclosure comprise sheet metal.

11. A system according to claim 1, wherein the surfaces of the enclosure comprise a metal grating.

12. A system for shielding an engine component of an equipment service vehicle, the equipment service vehicle having a frame assembly and a body, the body being coupled to the frame assembly, the system comprising:
    an enclosure being secured to the frame assembly or body of the vehicle, the enclosure having a plurality of sheet-metal panels, including a top panel, a bottom panel, and a plurality of sidewall panels, each of the plurality of sheet-metal panels having an edge and a surface, the enclosure being formed by joining an edge of each of the plurality of sheet metal-panels with an edge of a contiguous sheet-metal panel, the sheet-metal panels including a plurality of apertures formed in the surface of each sheet-metal panel, wherein the enclosure is configured to enclose the engine component of the vehicle; and
    a plurality of fastening elements configured to fasten the sheet-metal panels to the frame assembly or body of the equipment service vehicle;
    wherein each of the plurality of apertures includes a dimension in a first direction between 0.25 inches to 0.75 inches and a dimension in a second direction between 0.75 inches to 1.25 inches, such that the plurality of apertures are configured to minimize electromagnetic emissions within the frequency range of two megahertz (2 MHz) to one gigahertz (1 GHz).

13. A system according to claim 12, wherein the plurality of apertures are uniformly dimensioned.

14. A system according to claim 12, wherein the panels of the enclosure comprise a single continuous sheet of metal configured to shield the engine component of the equipment service vehicle.

15. A system according to claim 12, wherein the plurality of apertures are uniformly distributed on the surface of the panels.

16. A method for shielding an engine component of an equipment service vehicle, the steps comprising:
   forming an enclosure to surround the engine component, the enclosure having opposing sidewall surfaces and a surface substantially perpendicular to the sidewall surfaces, each surface having at least one edge and a plurality of apertures formed in the surfaces, the plurality of apertures being dimensioned to minimize electromagnetic emissions from the engine component of the equipment service vehicle;
   joining together an edge of each surface such that an edge of each surface being adapted to abut an edge of an adjacent surface to define the enclosure; and
   securing the enclosure to the equipment service vehicle.

17. A method according to claim 16, wherein the plurality of apertures are uniformly dimensioned.

18. A method according to claim 16, wherein the plurality of apertures comprises square-shaped apertures.

19. A method according to claim 16, wherein the plurality of apertures comprises parallelogram-shaped apertures, each of the apertures having a dimension in a first direction in the range of 0.25 inches to 0.75 inches and a dimension in a second direction in the range of 0.75 inches to 1.25 inches.

20. A method according to claim 16, wherein the plurality of apertures are configured to minimize electromagnetic emissions within the frequency range of two megahertz (2 MHz) to one gigahertz (1 GHz).

21. A method according to claim 16, wherein the plurality of apertures are configured to minimize electromagnetic emissions within the frequency range of one gigahertz (1 GHz) to ten gigahertz (10 GHz).

22. A method according to claim 16, wherein the plurality of apertures are configured to minimize electromagnetic emissions within the frequency range of ten gigahertz (10 GHz) to one-hundred gigahertz (100 GHz).

23. A method according to claim 16, wherein the plurality of apertures are uniformly distributed on the surfaces of the enclosure.

24. A method according to claim 16, wherein the surfaces of the enclosure comprise a single continuous sheet of metal configured to shield the engine component of the equipment service vehicle.

25. A method according to claim 16, wherein the surfaces of the enclosure comprise a metal grating.

26. An equipment service vehicle comprising:
   a movable frame assembly;
   a body including an occupant compartment, the occupant compartment being configured to receive a human;
   a plurality of drive wheels, coupled to the frame assembly;
   an engine component;
   an enclosure for the engine component, the enclosure being secured to the frame assembly or body, the enclosure having a plurality of sheet-metal panels, including a top panel, a bottom panel, and a plurality of sidewall panels, each of the plurality of sheet-metal panels having an edge and a surface, the enclosure being formed by joining an edge of each of the plurality of sheet metal-panels with an edge of a contiguous sheet-metal panel, the sheet-metal panels including a plurality of apertures formed in the surface of each sheet-metal panel; and
   a plurality of fastening elements configured to secure the sheet-metal panels to the military service vehicle.

27. A vehicle according to claim 26, wherein the plurality of apertures are uniformly dimensioned.

28. A vehicle according to claim 26, wherein the plurality of apertures comprises square-shaped apertures.

29. A vehicle according to claim 26, wherein the plurality of apertures comprises parallelogram-shaped apertures, each of the apertures having a dimension in a first direction in the range of 0.25 inches to 0.75 inches and a dimension in a second direction in the range of 0.75 inches to 1.25 inches.

30. A vehicle according to claim 26, wherein the plurality of apertures are configured to minimize electromagnetic emissions within the frequency range of two megahertz (2 MHz) to one gigahertz (1 GHz).

31. A vehicle according to claim 26, wherein the plurality of apertures are configured to minimize electromagnetic emissions within the frequency range of one gigahertz (1 GHz) to ten gigahertz (10 GHz).

32. A vehicle according to claim 26, wherein the plurality of apertures are configured to minimize electromagnetic emissions within the frequency range of ten gigahertz (10 GHz) to one-hundred gigahertz (100 GHz).

33. A vehicle according to claim 26, wherein the surfaces of the enclosure comprise a single continuous sheet of a rigid material configured to enclose the engine component of the equipment service vehicle.

34. A vehicle according to claim 26, wherein the plurality of apertures are uniformly distributed on the surfaces of the enclosure.

35. A system for shielding an engine component of a military service vehicle, the vehicle including a movable frame assembly, a body including an occupant compartment, and a plurality of drive wheels coupled to the frame assembly, the system comprising: an enclosure secured to the vehicle, wherein the enclosure is configured to enclose the engine component of the military service vehicle having a plurality of sheet-metal panels, including a top panel, a bottom panel, and a plurality of sidewall panels, each of the plurality of sheet-metal panels having an edge and a surface, the enclosure being formed by joining an edge of each of the plurality of sheet metal-panels with an edge of a contiguous sheet-metal panel, the sheet-metal panels including a plurality of uniformly distributed apertures formed in the surface of a sheet-metal panel, the plurality of apertures having a dimension in a first direction in the range of 0.01 inches to 1.25 inches and a dimension in a second direction in the range of 0.01 inches to 1.25 inches, wherein the plurality of apertures are configured to minimize electromagnetic emissions from the vehicle within the frequency range of two megahertz (2 MHz) to one-hundred gigahertz (100 GHz), and a plurality of fastening elements configured to secure the enclosure to the military service vehicle.

* * * * *